(12) United States Patent
Mori

(10) Patent No.: US 6,268,902 B1
(45) Date of Patent: Jul. 31, 2001

(54) EXPOSURE APPARATUS, AND MANUFACTURING METHOD FOR DEVICES USING SAME

(75) Inventor: Tetsuya Mori, Utsunomiya (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/622,364

(22) Filed: Mar. 26, 1996

Related U.S. Application Data

(63) Continuation of application No. 08/274,350, filed on Jul. 13, 1994, now abandoned.

(30) Foreign Application Priority Data

Jul. 14, 1993 (JP) .................................................. 5-174313

(51) Int. Cl.[7] ............................. G03B 27/68; G03B 27/42
(52) U.S. Cl. .................................................. 355/52; 355/53
(58) Field of Search .......................................... 355/77, 52

(56) References Cited

U.S. PATENT DOCUMENTS

| | | | |
|---|---|---|---|
| 4,496,239 | 1/1985 | Isohata et al. | 355/30 |
| 4,503,335 | 3/1985 | Takahashi | 250/548 |
| 4,538,914 | 9/1985 | Yomoda et al. | 356/400 |
| 4,688,932 | 8/1987 | Suzuki | 355/51 |
| 4,958,160 | 9/1990 | Ito et al. | 355/53 |
| 5,001,734 | 3/1991 | Uda et al. | 378/34 |
| 5,063,582 | 11/1991 | Mori et al. | 378/34 |
| 5,103,257 | 4/1992 | Wijnaendts-van-Resandt | 355/53 |
| 5,117,255 | * 5/1992 | Shiraishi et al. | 355/53 |
| 5,161,114 | 11/1992 | Akiyama | 364/490 |
| 5,168,304 | * 12/1992 | Hattori | 355/53 |
| 5,168,306 | 12/1992 | Morimoto et al. | 355/53 |
| 5,268,744 | 12/1993 | Mori et al. | 356/400 |
| 5,281,996 | * 1/1994 | Bruning et al. | 355/77 |
| 5,286,963 | * 2/1994 | Torigoe | 250/201.2 |
| 5,291,240 | * 3/1994 | Jain | 355/53 |
| 5,309,197 | 5/1994 | Mori et al. | 355/53 |

FOREIGN PATENT DOCUMENTS

| | | |
|---|---|---|
| 3910048 | 8/1990 | (DE) . |
| 05 15054 | 2/1993 | (JP) . |

OTHER PUBLICATIONS

Buckley "Expanding the Horizons of Optical Projection Lithography," Solid State Technology, May 1982, pp. 77 through 82.

* cited by examiner

Primary Examiner—Christopher E. Mahoney
(74) Attorney, Agent, or Firm—Fitzpatrick, Cella, Harper & Scinto

(57) ABSTRACT

An exposure apparatus includes an exposure device for exposing an exposure area of a substrate to a pattern of a mask, wherein the mask pattern is provided on the basis of a design pattern, and the mask pattern deviates in at least one of position, size and shape, from the design pattern, and a detector for detecting the deviation of the mask pattern from the design pattern and for producing a detection output. The exposure device is responsive to the output of the detector to effect an exposure operation to compensate for the pattern deviation.

15 Claims, 3 Drawing Sheets

EXPOSURE APPARATUS, AND MANUFACTURING METHOD FOR DEVICES USING SAME

This application is a continuation of application Ser. No. 08/274,350, filed Jul. 13, 1994 now abandoned.

FIELD OF THE INVENTION AND RELATED ART

The present invention relates to an exposure apparatus and a method of manufacturing devices using the same.

The recent progress of semiconductor device manufacturing and fine processing related thereto are remarkable. Particularly, photolithography is mainly effected by a reduction projection exposure apparatus (stepper) having a resolution of submicrons, and a larger numerical aperture (NA) and further reduction of wavelength of the light for the exposure have been developed toward further improvement in the resolution.

A one-to-one scanning type exposure apparatus using a reflection type projection optical system has improved. For example, there are noted a reduction projection optical system incorporating a refraction element such as a lens or the like in a projection optical system to combine with a reflection element such as a mirror, or a scanning type exposure apparatus in which a reduction projection optical system constituted only by refraction elements are used, and both a mask stage and a wafer stage are moved in a speed ratio corresponding to the reduction.

As a factor influencing alignment between a mask pattern and a wafer pattern, there is a deviation of EB writing (electron beam writing) of the mask pattern (original) from a design pattern. Conventionally, the deviation has been ignored because the amount of deviation is small.

SUMMARY OF THE INVENTION

Accordingly, it is an object of the present invention to provide an exposure apparatus and a method of manufacturing devices such as IC, LSI or other semiconductor devices, CCD, liquid crystal panels, magnetic heads or the like using the exposure apparatus, in which the mask pattern involving writing error can be correctly transferred onto a pattern of a member to be exposed.

According to an aspect of the present invention, there is provided an exposure apparatus having means for correcting the writing error of the pattern.

In the device manufacturing method according to an aspect of the present invention, the device pattern is transferred onto the member to be exposed using such an exposure apparatus.

According to another aspect of the present invention, means is provided to detect the pattern writing error on the basis of a position of the device pattern.

According to a further aspect of the present invention, means is provided to detect the pattern writing error on the basis of a position of the positioning mark on the mask.

According to a further aspect of the present invention, a positioning optical system for positioning the mask and the member to be exposed also functions as an optical system for detecting the writing error.

According to a further aspect of the present invention, the writing error of the pattern is corrected while scanning the mask and the member to be exposed with an exposure beam.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
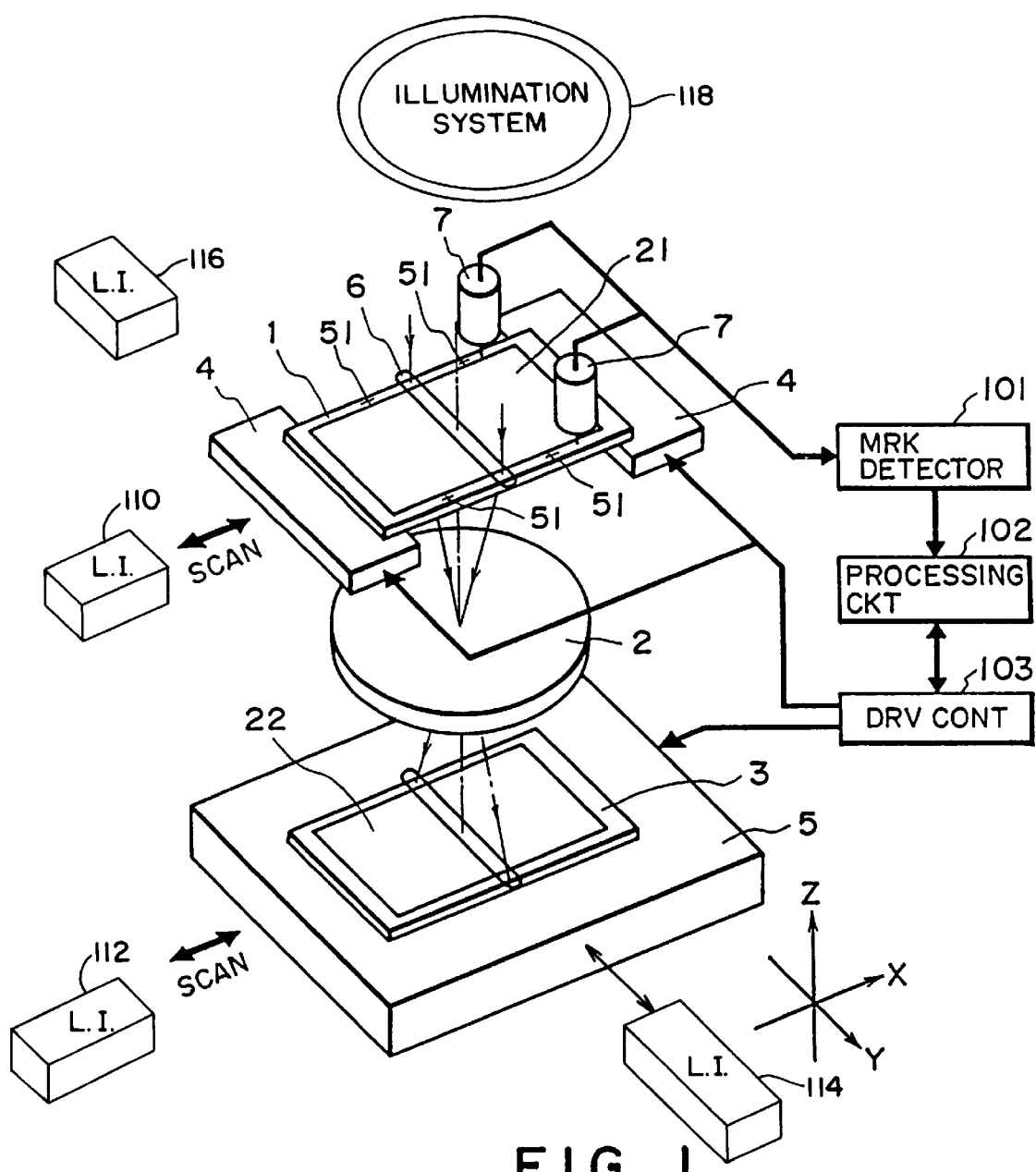
FIG. 1 is a schematic view illustrating an apparatus according to an embodiment of the present invention.

The preferred embodiments of the present invention will be described in conjunction with the accompanying drawings. FIG. 1 shows a scanning exposure apparatus according to an embodiment of the present invention, for manufacturing semiconductor devices or devices such as CCD, liquid crystal panels, magnetic heads or the like. A mask 1 having a written pattern is supported in a main assembly on a mask stage 4 driven and controlled in the XY direction by control means 103 and laser interferometers 110 and 116. The mask 1 and the wafer 3 are located in an optically conjugate position through the projection optical system 2. A slit-like exposure beam 6 extending in the Y direction from an unshown illumination system is projected on the mask 1, and the pattern of the mask 1 is imaged on a wafer 3 with a scale corresponding to the projection magnification of the projection optical system. For the scanning exposure, both the mask stage 4 and the wafer stage 5 are moved in the X direction at a speed ratio corresponding to the projection magnification of the projection optical system 2 relative to the slit exposure beam 6, so that the relative scanning is effected between the mask 1 and the wafer 3. By this, the entirety of the device pattern 21 of the mask 3 is transferred onto a transfer region (pattern region) 22 of the wafer 3. The projection optical system 2 may be constituted only by refraction elements by both reflection elements and refraction elements.

In this embodiment, the mask 1 is supported on a mask stage 4, and the state of pattern writing of the device pattern or the like on the mask 1 is measured. More particularly, a plurality of mask writing evaluation marks 51 (written together with the device pattern) arranged in XY directions on the mask 1, are observed by a pair of observing microscopes 7. A signal relating to mark 51 position obtained by the microscopes 7 is processed by mark detecting means 101, and the output thereof is transmitted to a processing circuit 102 as position information of the mask writing evaluation mark. The position of the mask stage 4 during the observation is measured by laser interferometers 110 and 116. The information relating to the position of the stage 4, is transmitted to a processing circuit 102 by drive control means 103, and is stored corresponding to the position information for the mask writing evaluation mark 51. The measurement is repeated for the plurality of mask writing evaluation marks 51, while controlling the position of the mask stage 4 using laser interferometers 110 and 116, by which a writing state of the mask pattern on the mask 1 is discriminated. The mask writing evaluation marks 51 are written by an electron beam writing device simultaneously with the device pattern 21, and therefore, represent original positions of the pattern 21, writing magnification (size) and/or the perpendicularity of the pattern. Therefore, when the writing magnification or the perpendicularity are to be measured, at least three mask writing evaluation marks 51 are required. In this Figure, the mask writing evaluation marks 51 are disposed in the manner of enclosing the device pattern 21. However, they may be disposed in the pattern 21 region. The configuration of the mark is not limited to a "cross". The device pattern 21 may be used as the mark.

During the exposure operation, a scanning driving method for correcting the detected writing error is instructed to the drive control means 103 from processing circuit 102 storing the writing state (error) of the pattern 21. Using an laser interferometers 110, 112, 114, and 116, the relative position between the mask stage 4 and the wafer stage 5 is controlled to correct the writing error, and therefore, the pattern 21 is transferred onto the transfer region 22 on the wafer with high accuracy.

Figure 2A:
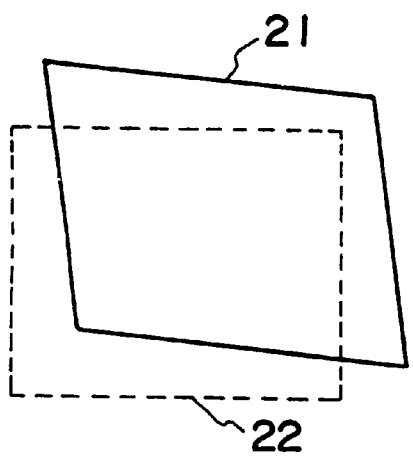
FIGS. 2A through 2D illustrate scanning exposure in the apparatus of FIG. 1.
Figure 2B:
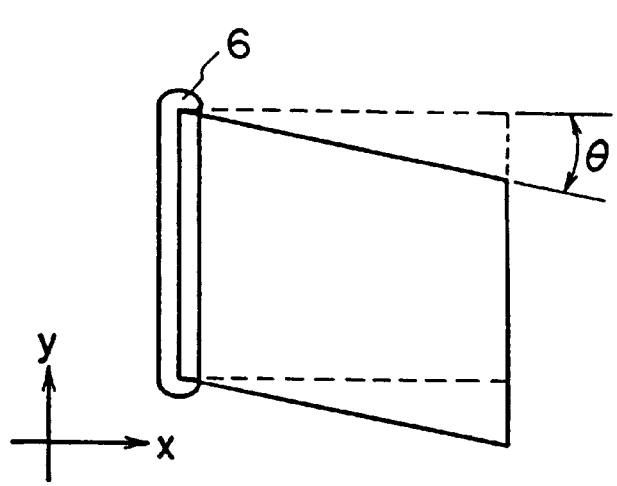
Figure 2C:
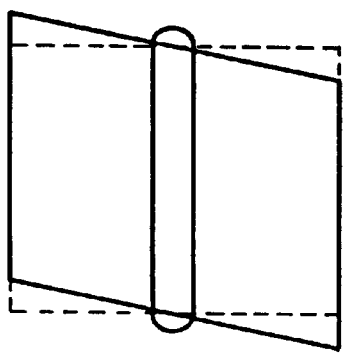
Figure 2D:
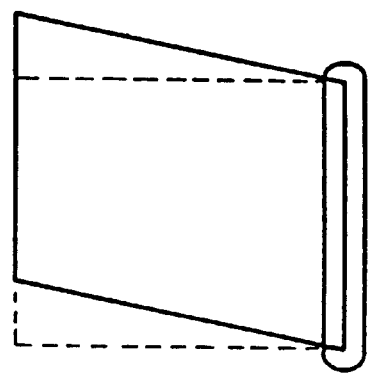

Consideration will be made to the case in which the pattern 21 is written with a perpendicularity error θ, as shown in FIG. 2A, for example. Using an unshown alignment system, the mask 1 and the wafer 3 are aligned, and the pattern 21 and the scanning start side of the transfer region 22 are aligned relative to the slit exposure light 6, as shown in FIG. 2B. Subsequently, the processing circuit 102 provides to the drive control means 103 the scanning drive method for correcting the perpendicularity error θ. More particularly, the mask stage 4 is driven inclinedly by a degree corresponding to the perpendicularity error θ, relative to the scanning direction (X) of the wafer stage 5. The mask stage 4 and the wafer stage 5 are moved relative to the slit exposure light 6 as shown in FIGS. 2B–2D, while controlling the positions using laser interferometers 110, 112 and 114. As a result, the transfer region 22 is exposed to the pattern 21 with the writing error corrected. Therefore, the patterns 21 and 22 can be overlaid with high precision.

The observation microscopes 7 in this embodiment may be used also as an alignment optical system for detecting positional deviation between the mask 1 and the wafer 3. When the positional deviation between the mask 1 and the wafer 3 is detected, the position of the mask writing evaluation marks 51 is also detected. At this time, the writing evaluation mark 51 of the mask 1 may be used also as the mask alignment mark, advantageously.

Figure 3:
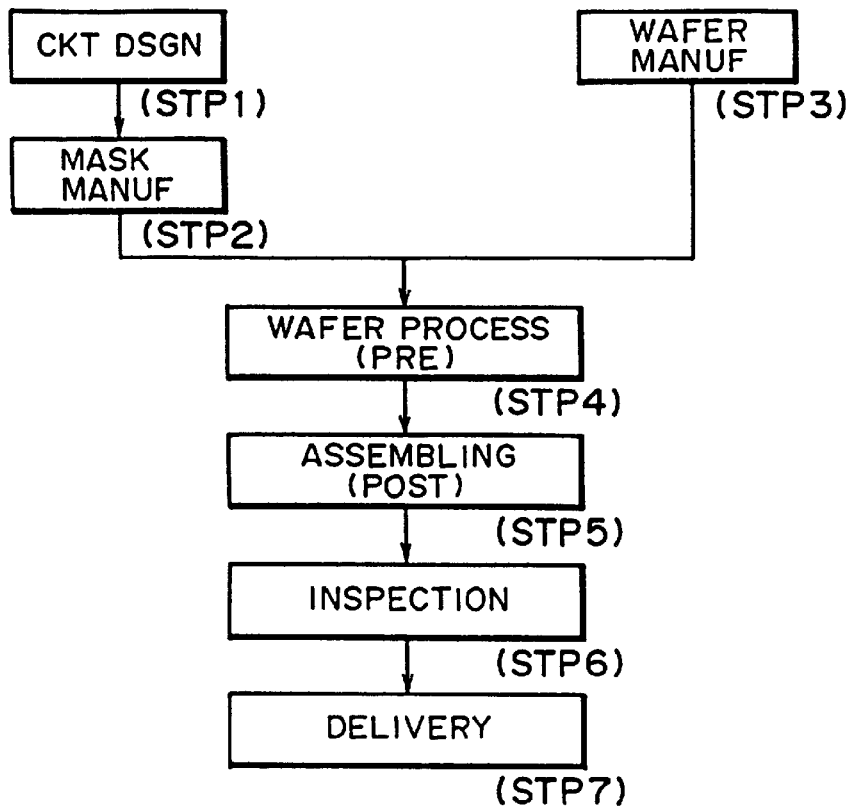
FIG. 3 is a flow chart for manufacturing a semiconductor device.

Description will be made as to an embodiment of a device manufacturing method using the scanning exposure apparatus. FIG. 3 is a flow chart of manufacturing semiconductor devices such as IC, LSI or the like, or devices such as liquid crystal panels or CCD or the like. At step 1, (circuit design), the circuits of the semiconductor device are designed. At step 2, the mask having the designed circuit pattern is manufactured. On the other hand, at step 3, a wafer is manufactured using the proper material such as silicon. Step 4 is called a pre-step, in which an actual circuit pattern is formed on a wafer through a lithographic technique using the prepared mask and wafer. At step 5 (post-step), a semiconductor chip is manufactured from the wafer subjected to the operations of step 4. The step 5 includes assembling steps (dicing, bonding), a packaging step (chip sealing) or the like. At step 6, the operation of the semiconductor device manufactured by the step 5 is inspected, and a durability test thereof is carried out. In this manner, the semiconductor device is manufactured and delivered at step 7.

Figure 4:
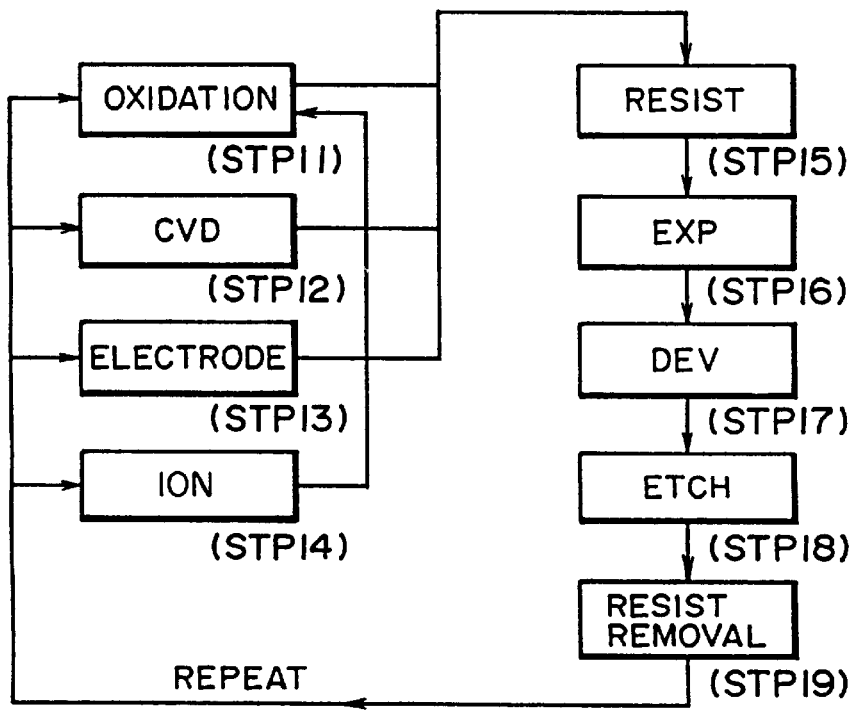
FIG. 4 shows a wafer process of FIG. 3.

FIG. 4 is a flow chart of detailed wafer processing. At step 11, the surface of the wafer is oxidized. At step 12 (CVD), an insulating film is formed on a surface of the wafer. At step 13 (electrode formation), an electrode is formed on the wafer by evaporation. At step 14 (ion injection), ions are implanted into the wafer. At step 15 (resist processing), a photosensitive material is applied on the wafer. At step 16 (exposure), the circuit pattern of the mask is projected onto the wafer by the above-described exposure apparatus. At step 17 (development), the exposed wafer is developed. At step 18 (etching), the portions outside the resist image are removed. At step 19 (resist removal), the resist is removed after the etching. By repeating the above-described steps, overlaid circuit patterns are formed on the wafer.

According to the manufacturing method of the invention, a highly integrated circuit pattern can be formed in the semiconductor devices or the like.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus comprising:

exposure means for exposing an exposure area of a substrate to a pattern of a mask, wherein the mask pattern is provided on the basis of a designed mask pattern, and the mask pattern deviates in at least one of position, size and shape, from the designed mask pattern; and detecting means for detecting the deviation of the mask pattern from the designed mask pattern and for producing a detection output, wherein said exposure means is responsive to the output of said detecting means to effect an exposure operation to compensate for the pattern deviation.

2. An apparatus according to claim 1, wherein said detecting means comprises measuring means for measuring a plurality of portions of a device pattern of the mask, and said detecting means detects the pattern deviation on the basis of an output of said measuring means.

3. An apparatus according to claim 1, wherein said detecting means comprises measuring means for measuring positions of a plurality of marks of the mask, and said detecting means detects the pattern deviations on the basis of an output of said measuring means.

4. An apparatus according to claim 3, wherein the plurality of marks also function as alignment marks for alignment of the mask with the substrate.

5. An apparatus according to claim 4, wherein said measuring means comprises an alignment optical system for detecting the alignment marks.

6. An apparatus according to claim 1, wherein said exposure means comprises means for illuminating the mask with an exposure beam and means for scanning the mask and the substrate relative to the exposure beam.

7. An apparatus according to claim 6, wherein when the pattern deviation in the shape includes a perpendicularity error, said scanning means is adapted to scan the mask and the substrate in different directions for the compensation.

8. A scanning type exposure apparatus comprising:

exposure means for exposing an exposure area of a substrate to a pattern of a mask by scanning the mask and the substrate relative to exposure light, wherein the mask pattern is provided on the basis of a designed mask pattern, and the mask pattern deviates in shape from the designed mask pattern; and detecting means for detecting the deviation of the mask pattern from the designed mask pattern and for producing a detection output, wherein said exposure means is responsive to the output of said detecting means to effect a scanning operation to compensate for the pattern deviation.

9. An exposure method using a mask having a pattern provided on the basis of a designed mask pattern, the mask pattern deviating in at least one of position, size and shape, from the designed mask pattern, said method comprising the steps of:

detecting the deviation of the mask pattern from the designed mask pattern; and compensating for the pattern deviation on the basis of the detection in said detecting step.

10. A method according to claim 9, wherein said compensating step comprises scanning the mask and the substrate to exposure light while relatively moving the mask and the substrate.

11. A method according to claim 10, wherein when the pattern deviation in the shape includes a perpendicularity error, the mask and the substrate are scanned in different directions for the compensation.

12. A method according to claim 9, wherein said detecting step comprises measuring a plurality of portions of a device pattern of the mask, and detecting the pattern deviation on the basis of the measurement.

13. A method according to claim 9, further comprising measuring positions of a plurality of marks on the mask, and wherein said detecting step detects the pattern deviation on the basis of the measurement.

14. A scanning exposure method using a mask having a pattern provided on the basis of a designed mask pattern, the mask pattern deviating in shape from the designed mask pattern, said method comprising the steps of:

detecting the deviation of the mask pattern from the designed mask pattern; and scanning the mask and the substrate relative to exposure light so as to compensate for the pattern deviation, on the basis of the detection in said detecting step.

15. A method of manufacturing a device comprising the steps of:

exposing a substrate using an exposure method according to any one of claims 9, 10, 11, 12, 13 or 14; and thereafter, developing the exposed substrate.

* * * * *

UNITED STATES PATENT AND TRADEMARK OFFICE
CERTIFICATE OF CORRECTION

PATENT NO.   : 6,268,902 B1
DATED        : July 31, 2001
INVENTOR(S)  : Tetsuya Mori It is certified that error appears in the above-identified patent and that said Letters Patent is hereby corrected as shown below:

Column 1,
Lines 13 and 27, "are" should read -- is --.

Column 2,
Line 36, "that the" should read -- that --; and
Line 41, "by" should read -- or by --.

Column 3,
Line 1, "are" should read -- is --;
Line 11, "an" should be deleted;
Lines 22 and 30, "light 6" should read -- light beam 6 --; and
Line 47, "step 1," should read -- step 1 --.

Signed and Sealed this

Thirtieth Day of April, 2002

Attest:

Attesting Officer

JAMES E. ROGAN
Director of the United States Patent and Trademark Office